Sept. 18, 1962 J. Y. PAYTON ET AL 3,054,907

COMPLEMENTARY FLIP-FLOP UTILIZING AUXILIARY DRIVING TRANSISTORS

Filed March 29, 1957

INVENTORS.
John C. Larson,
James Y. Payton,
BY Edw. A. Oser
AGENT 3,054,907

COMPLEMENTARY FLIP-FLOP UTILIZING AUXILIARY DRIVING TRANSISTORS

James Y. Payton, Gardena, and John C. Larson, Los Angeles, Calif., assignors to Hughes Aircraft Company, Culver City, Calif., a corporation of Delaware
Filed Mar. 29, 1957, Ser. No. 649,563
4 Claims. (Cl. 307—88.5)

Figure 1:
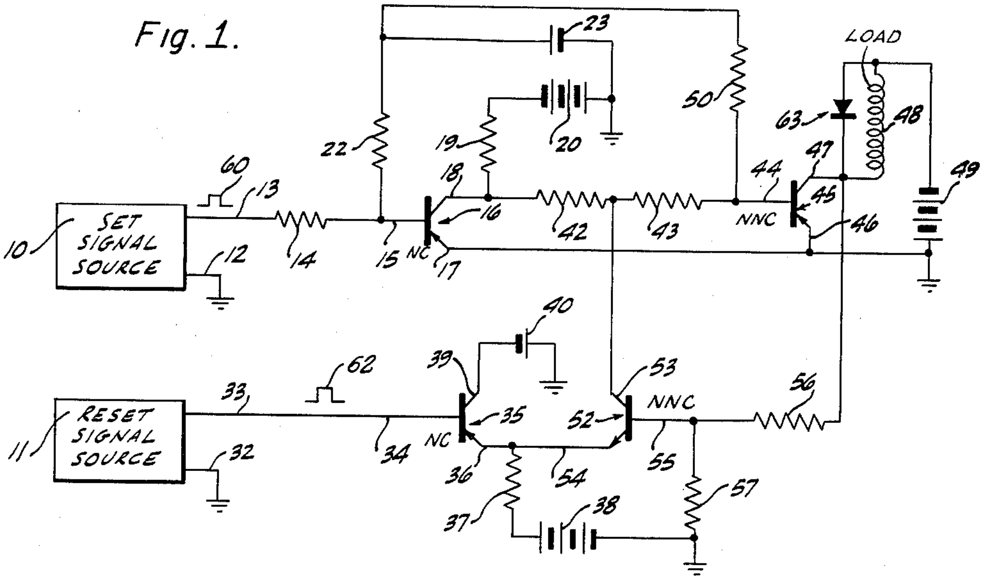

The present invention relates to control circuits and more particularly to a bistable lock-in circuit adapted to provide a constant level output signal to a load.

In the use of relays it is often necessary to provide control of the relay using pulse signals of considerably shorter time duration than the pull-in time of the relay. In addition, sufficient current must be supplied to the relay to assure pull-in. Thus, when a pulse signal of short time duration is used to energize a relay, circuitry must be provided to supply the relay with enough current for a sufficiently long time period to insure pull-in of the relay.

In the use of electronic digital computers it is often desirable to use a pulse signal to generate an output signal of constant amplitude for indefinite time duration for a load element which may require a large amount of current.

In the prior art, bistable circuits have been used to supply a constant level output signal of indefinite time duration in response to an input pulse signal. Prior art bistable circuits, however, are limited by the amount of current which they can provide to a load element. Therefore, if the load is a relay winding or some other element requiring a large amount of current, additional circuitry is required.

Accordingly, it is an object of the present invention to provide an improved lock-in circuit adapted to supply an output signal of constant amplitude to a load element which may require a large current.

Another object of the present invention is to provide a lock-in network utilizing a bistable circuit adapted to provide a large output current.

A further object of the present invention is to provide an improved bistable circuit using semiconductor amplifiers and adapted to supply a large current to a load element such as a relay in response to a pulse signal.

In accordance with the present invention a pair of signal sources provide the control signals to a bistable circuit through a pair of semiconductor amplifiers. One signal source provides what may be termed a "set" signal, or pulse, and the other a "reset" pulse.

The bistable circuit itself includes an output transistor adapted to provide a signal of indefinite time duration to a load element (which may be a relay) in response to the applied set pulse signal. A second transistor in the bistable circuit is coupled to the first transistor in a manner such that the second transistor serves as a switch to maintain the first transistor conductive until a reset pulse is applied to the switching transistor. When the reset pulse signal is applied to the switching transistor the output transistor is rendered nonconductive.

The novel features that are considered characteristic of the present invention are set forth with particularity in the appended claims. The invention itself, however, both as to its organization and method of operation as well as additional objects and advantages thereof will be more clearly understood from the following description when read in connection with the accompanying drawing and in which, FIG. 1 is a circuit diagram of one embodiment of the bistable lock-in circuit of the present invention; and, FIG. 2 is a graphical representation of voltages versus time illustrating the operation of the lock-in circuit of FIG. 1.

Figure 2:
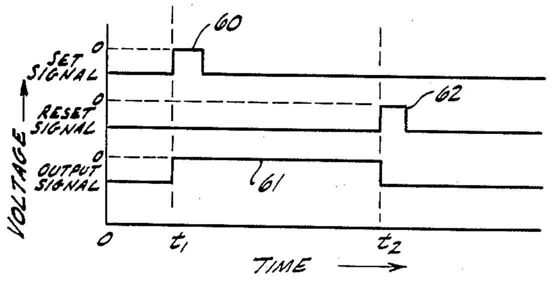

Referring now to the drawing and in particular to FIG. 1, a pair of signal sources are shown diagrammatically as a set signal source 10 and a reset signal source 11.

These signal sources may advantageously be the output signal sources of a logic circuit arrangement, such as is commonly used in an electronic digital computer. Thus, each signal source may be adapted to provide a normally constant level signal which may have a negative polarity with respect to a fixed reference potential referred to as ground. The signal sources may also be adapted to periodically provide pulse signals which are positive going with respect to the normal constant level.

The set signal source 10 has a first signal output terminal 12 connected to ground and a second signal output terminal 13 coupled through a base resistor 14 to a base electrode 15 of a first transistor shown for purpose of illustration as a PNP junction transistor 16. Transistor 16 has an emitter electrode 17 connected to ground and a collector electrode 18 coupled through a collector resistor 19 to the negative terminal of a source of direct current (D.C.) potential shown for purpose of illustration as a battery 20 having its positive terminal connected to ground. The base 15 is also coupled through a bias resistor 22 to the positive terminal of another source of D.C. bias such as the battery 23 having its negative terminal connected to ground.

Assuming the set signal source 10 is adapted to normally maintain the signal output terminal 13 at a potential which is negative with respect to ground, the first transistor 16 is biased to be normally conductive. This is true since the current flow through the voltage divider network including the bias resistor 22 and the base resistor 14 from the voltage source 23 to ground through the set signal source 10 may be adjusted to maintain the base 15 at a potential which is normally at ground or a potential negative with respect to ground. Thus, the emitter-base junction is forward-biased and a relatively large current may pass through the emitter-collector circuit.

In a similar manner the reset signal source 11 has a first signal output terminal 32 connected to ground and a second signal output terminal 33 connected to a base electrode 34 of a second PNP junction transistor 35 having an emitter electrode 36 coupled through an emitter resistor 37 to the positive terminal of a battery 38 having a negative terminal connected to ground. The transistor 35 has a collector electrode 39 connected directly to the negative terminal of a battery 40 having its positive terminal grounded.

It is thus seen that if the reset signal source 11 is adapted to maintain the base 34 normally at a negative potential with respect to ground the emitter-base junction is forward-biased and the transistor 35 is normally conductive (NC). Therefore, the emitter electrode 36 is clamped substantially to the negative potential provided by the battery 40 through the emitter-collector path.

It is to be noted that the transistors 16 and 35 as well as others shown in the circuit, are illustrated as being of particular conductivity types. This is of course only for purpose of illustration, and it is to be expressly understood that the teaching of the present invention could also be practiced using different type transistors by making the necessary bias and signal input polarity changes.

The transistor 16 is coupled through a dropping resistor 42 and a base resistor 43 to a base electrode 44 of a signal output transistor 45 of a bistable circuit. The output transistor 45 is shown as a PNP junction transistor having an emitter electrode 46 connected directly to ground and a collector electrode 47 coupled through a load element 48 to the negative terminal of a battery 49 having its positive terminal connected to ground. The base 44 of the output transistor 45 is also coupled through a bias resistor 50 to the positive potential provided by the battery 23.

Since the circuit of the present invention may advantageously be used to provide the pull-in current for a relay, the load element 48 is shown diagrammatically as the control winding of a relay. It is of course to be understood that the load element is shown as a relay winding only for purposes of illustration.

A second transistor of the bistable circuit, which may be termed a switching transistor, is shown for purpose of illustration as an NPN junction transistor 52 having a collector electrode 53 connected to the junction point of the base resistor 43 and the dropping resistor 42. The switching transistor 52 has an emitter electrode 54 connected directly to the emitter 36 of the transistor 35, and a base electrode 55 coupled through a base resistor 56 to the collector 47 of the output transistor 45. As will be more fully explained in conjunction with the operation of the circuit, a bias resistor 57 may be connected between the base 55 of the switching transistor 52 and ground to provide protection of the base-emitter junction.

In the absence of a positive going input signal from either of the two signal sources, the transistors 16 and 35 are normally conductive. Thus the collector 18 of the first transistor 16 is essentially at ground potential due to the current flow from ground through emitter 17 to the collector, and the current flow from the battery 23 through the voltage divider network including the bias resistor 50, the base resistor 43 and the dropping resistor 42 to the collector 18 and thence to the battery 20 serves to maintain the base 44 of the output transistor at a potential which is positive with respect to ground. Therefore, since the emitter 46 of the output transistor is directly grounded, the emitter-base junction is back-biased and the output transistor 45 is normally nonconductive.

The switching transistor 52 is also normally (NNC) nonconductive since the emitter 54 is clamped through the emitter-collector circuit of the transistor 35 to the negative potential provided by the battery 40 and the base 55 is more negative than the emitter. If the bias resistor 57 is not included in the circuit the batteries 49 and 40 may be so selected that the base 55 is normally more negative than the emitter 54. If the bias resistor 57 is included in the circuit the values of the bias resistor 57 and that of the base resistor 56 in conjunction with the voltage source 49 are so selected that in the absence of an input signal from either of the signal sources, the current flow through the voltage divider network composed of the bias resistor 57, the base resistor 56, and the load element 48 is such that the base 55 is normally negative with respect to the emitter 54. By including the bias resistor 57 in the circuit the voltage source 49 may be made relatively large to provide ample current for the output of the circuit and yet not supply a potential which is sufficiently large to damage the switching transistor 52. That is, the current flow through the bias resistor 57 may be so adjusted that the base potential 55 does not differ by a substantial amount from the potential of the emitter 54.

As set forth above, in the quiescent condition of the circuit the first and second transistors 16 and 35 are conductive and the two transistors 45 and 52 of the bistable circuit are nonconductive. When a positive going signal or pulse 60 is provided by the signal source 10 to the base 15 of the first transistor 16 the first transistor 16 is rendered nonconductive and the potential of its collector 18 becomes more negative. This negative change in collector potential is conveyed to the base 44 of the output transistor and causes the output transistor 45 to become conductive. Thus the collector 47 of the output transistor 45 is clamped essentially to ground potential through the collector-emitter path and a relatively large current is provided to the load element 48.

When the potential of the collector 47 of the output transistor 45 goes to ground the base 55 of the switching transistor tends to rise in potential, thereby rendering the switching transistor 52 conductive.

The circuit values including the potentials of the batteries 20 and 38 may be so selected in conjunction with the voltage divider network including the collector resistor 19, the dropping resistor 42, the base resistor 43, and the bias resistor 50 that when the output transistor 45 is conductive the collector 53 of the switching transistor is negative with respect to the potential of its emitter 54. If this is done the bidirectional current conductive characteristic of a junction transistor is utilized and current flows from the battery 38 through the emitter resistor 37, the emitter-collector circuit of the switching transistor 52, the dropping resistor 42, and collector resistor 19 to the negative terminal of the battery 20. In this manner the collector 53 is clamped essentially to the potential provided by the battery 40 through the transistor 35. The base 44 of the output transistor is thereby maintained negative with respect to the grounded emitter 46 and the output transistor remains conductive. Thus the switching transistor 52 serves as an effective clamp to maintain the output transistor 45 conductive.

After the trailing edge of the positive going pulse applied by the signal source 10 to the base of the first transistor 16 has occurred, the base potential drops and the first transistor is again rendered conductive. Thus as previously explained the collector 18 is again clamped essentially to ground. Therefore current now flows from ground through the emitter-collector circuit of the first transistor 16, through the dropping resistor 42, through the collector-emitter circuit of the switching transistor 52, and through the transistor 35 to the battery 40. Therefore, the current flow through the switching transistor 52 is reversed, but the collector 53 of the switching transistor remains clamped to the negative potential provided by the battery 40 through the emitter-collector path of the transistor 35. In this manner the base of the output transistor 45 is prevented from rising and the output transistor remains conductive.

It is of course evident that the value of the collector resistor 19, the dropping resistor 42, the base resistor 43 and the bias resistor 50 in conjunction with the various potentials could be so selected that there is no current reversal through the switching transistor 52. That is, if prior to conduction of the switching transistor 52 the junction point of the dropping resistor 42 and the base resistor 43 is at a potential more positive than that to which the emitter 54 is clamped, the current flow through the switching transistor will be in the same direction from collector to emitter and no reversal of the current flow takes place.

It is to be noted that the bias conditions for the switching transistor 52 are such that the collector and emitter electrodes may be interchanged. However, by using the switching transistor in the manner above described it is found that there is less likelihood of failure of the emitter-base junction due to high voltage conditions.

Once the switching transistor 52 and the output transistor 45 are rendered conductive the circuit remains in that condition until a positive going pulse is provided by the second signal source 11. When a positive going signal such as the pulse 62 is applied to the base 34 of the transistor 35 the conduction of that transistor is immediately decreased or momentarily cut off. Since the transistor 35 is operating essentially as an emitter follower, the emitter potential rises. This positive going change in potential of the emitter 36 results in a rise in potential of the emitter 54. Thus, the conduction of the switching transistor 52 is decreased, the base of the output transistor 45 rises in potential decreasing the conduction of the output transistor, and the base 55 of the switching transistor becomes more negative. Therefore, the emitter-base junction of the switching transistor 52 becomes back-biased and the switching transistor is rendered nonconductive.

When the switching transistor 52 is rendered nonconductive the junction point of the dropping resistor 42 and the base resistor 43 is no longer clamped to a potential negative with respect to ground and the potential of the base 44 of the output transistor 45 rises to the earlier described positive potential. Thus the output transistor 45 is rendered nonconductive and the circuit is returned to its original condition where it remains until a new cycle is initiated by the application of a pulse by the signal source 10.

In FIG. 2 the time-voltage relationship between the input signals provided by the signal sources 10 and 11 with respect to the output signal provided by the output transistor 45 is shown diagrammatically. Thus when an input set pulse 60 is applied by the signal source 10 to the base of the transistor 16 at time $t_1$ an output signal 61 is provided across the load 48 by the output transistor 45. As described above, the output signal level then remains at a level which is more positive than the quiescent level until a time $t_2$ when a reset signal 62 is provided by the signal source 11. The reset signal 62 then causes the output transistor 45 to be nonconductive in a manner above described and the output signal level changes at time $t_2$ to its quiescent value. It is thus seen that the level of the output signal 61 remains at a constant amplitude throughout the time interval between $t_1$ and $t_2$. Therefore it is evident that the circuit of the present invention may be utilized to provide logic output signals, control signals for a relay, or for any of a wide variety of purposes for which a steady state signal is desired, and in particular where a large amount of current is required.

If a relay winding is used as the output load element for the bistable lock-in circuit of the present invention it may be advantageous to place a unidirectional current conductive device such as a diode 63 in parallel with the load. Thus when the output transistor 45 is rendered nonconductive a discharge path is provided for the resulting current surge which may tend to appear and which might damage the output transistor 45 if such a discharge path is not provided.

It is to be expressly understood that although a relay winding has been shown for purpose of illustration as the load element for the lock-in circuit, other load elements could well be utilized. One such load could be a diode clamp connected to the collector electrode 47 of the output transistor and a resistor connected in place of the relay winding. In this manner a logic output signal having a relatively large current capability could be provided.

While it is to be expressly understood that the circuit specifications of the bistable lock-in circuit of the present invention may vary according to the design for any particular application, the following specifications for the circuit of FIG. 1 are included by way of example only.

| | |
|---|---|
| Transistors **16**, **34**, and **45** | General Electric Type 2N43. |
| Transistor **55** | General Electric Type 2N78. |
| Resistor **14** | 6800 ohms. |
| Resistor **19** | 4700 ohms. |
| Resistor **22** | 10,000 ohms. |
| Resistor **42** | 10,000 ohms. |
| Resistor **43** | 10,000 ohms. |
| Resistor **50** | 22,000 ohms. |
| Resistor **37** | 22,000 ohms. |
| Resistor **56** | 10,000 ohms. |
| Resistor **57** | 10,000 ohms. |
| Voltage source **20** | −28 volts. |
| Voltage source **23** | +1.5 volts. |
| Voltage source **38** | +28 volts. |
| Voltage source **40** | −6 volts. |
| Voltage source **49** | −28 volts. |
| Load element **48** | North Electric Relay Type 226BCC 504E. |

The bistable lock-in circuit which was provided in accordance with the above circuit specifications was utilized to insure lock-in of a relay having a thirty millisecond pull-in time utilizing control signals of approximately seven microseconds time duration. It is of course evident that the circuit values could be varied to provide control utilizing pulse signals of shorter time duration.

There has thus been disclosed a bistable lock-in circuit utilizing transistors to provide an output signal of indefinite time duration utilizing control signals of short time duration. In addition the circuit disclosed herein is adapted to provide an output signal to a load which may require a large amount of current.

What is claimed is:

1. A bistable circuit comprising: first and second transistors, each having a base electrode, an emitter electrode, and a collector electrode, said collector electrode of said first transistor coupled to said base electrode of said second transistor and said base electrode of said first transistor coupled to the collector electrode of said second transistor; a load potential source coupled to said collector electrode of said first transistor; a first potential source coupled to said emitter electrode of said first transistor; first bias means coupled to said base electrode of said first transistor for maintaining said first transistor normally nonconductive; a first signal input circuit coupled to said first bias means for supplying a first signal of short duration thereto for controlling said first bias means to bias said first transistor into conduction to pass current to said load potential source, thereby impressing the potential from said first potential source onto said base electrode of said second transistor; second bias means coupled to said emitter electrode of said second transistor for supplying a potential to said emitter electrode of said second transistor for biasing said second transistor into conduction in combination with a potential impressed on said base electrode of said first transistor from said first bias means, said potential from said second bias means passing from said emitter electrode of said second transistor to said base electrode of said first transistor when said second transistor is biased into conduction, thereby maintaining said first transistor conductive at the termination of said first signal; and a second signal input circuit coupled to said second bias means for supplying a second signal thereto for controlling said second bias means to disconnect said potential supplied to said emitter electrode of said second transistor and to said base electrode of said first transistor, thereby rendering said first and said second transistor nonconductive.

2. A bistable circuit for providing an output signal of a controlled time duration to a load in response to a first and second input signal of short time duration, said circuit comprising: a first, second, third and fourth source of potential; a first transistor having an emitter coupled to said first source of potential, a collector coupled through said load to said second source of potential, and a base coupled to said third source of potential for biasing said first transistor into conduction; a first means coupled to said base of said first transistor and to said first source of potential for passing said first potential to said base to prevent said third source of potential from biasing said first transistor into conduction and for maintaining said first transistor normally nonconductive; a second transistor having a base coupled to said collector of said first transistor, having an emitter-collector circuit serially connected between said base of said first transistor and said fourth source of potential; second means coupled between said fourth source of potential and said emitter-collector circuit of said first transistor for normally passing the potential from said fourth source of potential to said second transistor; a first signal input means coupled to said first means to supply said first input signal for disconnecting said first source of potential from said base of said first transistor to allow said third source of potential to render said first transistor conductive, thereby passing said potential from said first source of potential to said collector of said first transistor and to said base of said second transistor to render said second transistor conductive in combination with said potential from said fourth source of potential passed to said second transistor, said second transistor when conductive passing said potential from said fourth source of potential to said base of said first transistor to maintain said first transistor in conduction after the time of occurrence of said first input signal; and a second signal input means coupled to said second means to supply said second input signal for disconnecting said fourth source of potential from said second transistor, thereby rendering said first and second transistors nonconductive, whereby the emitter to collector current flow of said first transistor provides a current to said load between the time of occurrence of said first and second input signals.

3. A control circuit receiving a set signal from a set signal source to pass a current pulse through a load and receiving a reset signal from a reset signal source to prevent said current pulse from passing through said load, said circuit comprising: a first transistor having a base, an emitter, and a collector; first potential means coupled to said emitter of said first transistor for maintaining said emitter of said first transistor at a fixed reference potential; a resistor network including a first and second resistor connected together and having a first end of said network coupled to said base of said first transistor, said network having a second end; a second positive potential means coupled to said first end of said resistor network; a third potential means negative in respect to said reference potential coupled to said second end of said resistor network; a third resistor coupled between said third potential means and said second end of said resistor network; a fourth potential means negative with respect to said reference potential coupled through said load to said collector of said first transistor; a second transistor having a base, an emitter, and a collector, said base coupled to said collector of said first transistor for maintaining said second transistor nonconductive when said first transistor is nonconductive, said collector coupled to said network between said first and second resistors; fifth potential means coupled to said emitter of said second transistor for supplying a potential negative with respect to said reference potential; a first control circuit coupled between said second end of said resistor network and said first potential means for providing current through said third resistor for allowing said second potential means to maintain said first transistor normally nonconductive, said first control circuit coupled to said set signal source to respond to said set signal for disconnecting said fixed reference potential of said first potential means from said third resistor to allow said third potential means to render said first transistor conductive to pass said current pulse through said load, thereby passing said fixed reference potential to said base of said second transistor to render it conductive; a second control circuit coupled between said emitter of said second transistor and said fifth potential means to normally pass said negative potential from said fifth means to said emitter of said second transistor allowing said second transistor to conduct when said first transistor conducts, thereby passing said negative potential from said emitter of said second transistor to said base of said first transistor for clamping said first transistor in conduction after the termination of said set signal, said second control circuit coupled to said reset signal source to respond to said reset signal for disconnecting said fifth source of potential from said emitter of said second transistor, whereby said first and second transistor are biased out of conduction to terminate said current pulse through said load.

4. A control circuit for providing an output signal to a load requiring a large current for a predetermined time interval controlled by a first and a second input signal of short time duration with respect to the predetermined time interval, said circuit comprising: a first, second, third, fourth and fifth source of potential; first and second PNP transistors each having a base, a collector, and an emitter, said first source of potential coupled to said collector of said first transistor, said second source of potential coupled to said emitter of said first transistor, said third source of potential coupled to said collector of said second transistor, said first and second transistors being normally conductive; a third PNP transistor having an emitter coupled to said second source of potential, a collector coupled through said load to said fourth source of potential which is negative with respect to said second source of potential, and a base coupled to said collector of said first transistor and coupled to said fifth source of potential to maintain said third transistor normally nonconductive; a fourth NPN transistor having a base coupled to said collector of said third transistor, a collector coupled to said base of said third transistor, and an emitter coupled to said emitter of said second transistor, said fourth transistor being normally non conductive; a resistor coupled between said first source of potential and said base of said third transistor; a first signal means coupled to said base of said first transistor to normally pass current from said second source of potential to said first source of potential to allow said fifth source of potential to maintain said third transistor nonconductive, and responding to said first input signal to disconnect said second potential from said first source of potential, thereby allowing said first source of potential to render said third transistor conductive; and a second signal means coupled to the said base of said second transistor for normally passing said potential from said third source of potential to said emitter of said fourth transistor for biasing said fourth transistor into conduction when said first transistor is conductive and to pass said potential from said emitter of said fourth transistor to said base of said third transistor for maintaining said third transistor conductive after being rendered conductive in response to said first input signal, said second signal means responding to said second input signal to disconnect said third source of potential from said emitter of said fourth transistor to thereby bias said third and fourth transistors into nonconduction, whereby said output signal is passed to said load between the time of occurrence of said first and second input signal.

References Cited in the file of this patent

UNITED STATES PATENTS

| | | |
|---|---|---|
| 2,404,527 | Potapenko | July 23, 1946 |
| 2,412,111 | Wilson | Dec. 3, 1946 |
| 2,707,752 | Gabler | May 3, 1952 |
| 2,714,658 | Greenfield | Aug. 2, 1955 |
| 2,729,808 | Auerbach et al. | Jan. 3, 1956 |
| 2,751,545 | Chase | June 19, 1956 |
| 2,763,832 | Shockley | Sept. 18, 1956 |
| 2,770,732 | Chong | Nov. 13, 1956 |
| 2,788,449 | Bright | Apr. 9, 1957 |
| 2,882,424 | Wohr | Apr. 19, 1959 |
| 2,903,604 | Henle | Sept. 8, 1959 |
| 2,907,895 | Overbeek | Oct. 6, 1959 |
| 2,916,636 | Wanlass | Dec. 8, 1959 |
| 2,980,805 | Moody | Apr. 18, 1961 |
| 2,986,649 | Wray | May 30, 1961 |

OTHER REFERENCES

20 The C-D Capacitor 7, FIG. 5, July 1955.